United States Patent [19]

Debe

[11] Patent Number: 5,176,786
[45] Date of Patent: Jan. 5, 1993

[54] ORGANIC THIN FILM CONTROLLED MOLECULAR EPITAXY

[75] Inventor: Mark K. Debe, Stillwater, Minn.

[73] Assignee: Minnesota Mining and Manufacturing Company, St. Paul, Minn.

[21] Appl. No.: 513,943

[22] Filed: Apr. 24, 1990

Related U.S. Application Data

[62] Division of Ser. No. 219,004, Jul. 13, 1988, Pat. No. 4,940,854.

[51] Int. Cl.$^5$ ............................................. C30B 23/00
[52] U.S. Cl. .................................... 156/600; 156/610; 156/613; 156/614; 156/DIG. 113
[58] Field of Search ............... 156/610, 611, 613, 614, 156/DIG. 113

[56] References Cited

U.S. PATENT DOCUMENTS

| | | | |
|---|---|---|---|
| 4,016,331 | 4/1977 | Garito et al. | 428/421 |
| 4,531,809 | 7/1985 | Carter et al. | 430/321 |
| 4,536,450 | 8/1985 | Garito | 428/421 |
| 4,554,076 | 11/1985 | Speaker | 210/639 |
| 4,684,434 | 8/1987 | Thakur et al. | 156/DIG. 113 |
| 4,698,121 | 10/1987 | Thakur et al. | 156/DIG. 113 |
| 4,737,232 | 4/1988 | Flicstein et al. | 156/DIG. 113 |
| 4,863,763 | 9/1989 | Takeda et al. | 427/355 |

OTHER PUBLICATIONS

M. Komiyama et al. "Preparation of Highly Ordered Ultra Thin Films of Copper(11) Phthalocyanine on Amorphous Substrates by Molecular Beam Deposition," *Thin Solid Films*, vol. 151, No. 1, Jul. 20, 1987, Lausanne CH pp. 109-110.
Asignee's copending application Ser. No. 07/570,623.
M. K. Debe, *J. Vac. Sci. Technol.* A 5(4), Jul./Aug. 1987, pp. 2406-3611.
M. K. Debe, Interfacial Phenomena in the New and Emerging Technologies, Ed. W. B. Krantz, May. 29-31, 1986, pp. 5-46 to 5-16.
M. K. Debe et al., Polymer Preprints 28 (2), Am. Chem. Soc., Aug. 1987, pp. 453-454.
Saito et al., "Molecular Energetics of the Epitaxial Growth of Chlorinated Copper Phthalocyanine on KCL Substrates", J. of Cry. Growth vol. 67 (1984) pp. 91-96.
Ashida et al. (I) "Thermal Transformation of Vacuum--Condensed Thin Films of Copper Phthalocyanine", Jour. of Crystal Growth, vol. 8 (1971) pp. 45-56.
Ashida et al (II), "Unit Cell Metastable Form Constants of Various Phthalocyanines", Bulletin of the Chemical Society of Japan, vol. 39, pp. 2616-2624 (1966).
Debe, "Extracting Physical Structure Information from the Organic Films with R.A.I.S.", J. Appl. Phys. 55(9) May 1, 1984 pp. 3354-3366.
"Recent Developments in the Theory of Epitaxy," J. H. van der Merwe, *Chemistry and Physics of Solid Surfaces V*, Eds. R. Vanselow and R. Howe, Springer-Verlag, N.Y. (1984), pp. 365-401.
"Growth from the Vapor Phase," *Modern Theory of Crystal Growth* I, Ed. A. A. Chernov, Springer-Verlag, N.Y. (1983), Chapter 8.

(List continued on next page.)

*Primary Examiner*—Robert Kunemund
*Attorney, Agent, or Firm*—Gary L. Griswold; Walter N. Kirn; Carolyn V. Peters

[57] ABSTRACT

A layered structure comprises in sequence a substrate, and coated on at least a portion of at least one surface of said substrate a first layer comprising a crystalline uniaxially oriented organic compound, and at least one additional layer comprising a crystalline uniaxially oriented organic compound which is epitaxially vapor deposited on said first layer.

A method for providing the layered structure of the invention comprises the steps of
(a) providing a substrate,
(b) depositing and crystallographically uniaxially orienting a first organic (seed) layer onto the substrate,
(c) depositing from the vapor phase at least one additional organic layer onto the oriented seed layer to provide a layered structure wherein the at least one additional layer is epitaxial with the seed layer.

9 Claims, 6 Drawing Sheets

OTHER PUBLICATIONS

N. Uyeda, T. Kobayashi, E. Suito, Y. Harada & M. Watanable, *J. Phys.*, 43(12) (1972) 5181.

M. Ashida, *Bulletin of the Chemical Society of Japan* 39(12), (1966) 2625-2631 and 2632-2638.

H. Saijo, T. Kobayashi & N. Uyeda, *J. of Crystal Growth*, 40 (1977) 118-124.

M. Ashida, N. Uyeda & E. Suito, *J. of Crystal Growth*, 8 (1971) 45-56.

Y. Marata, J. R. Fryer & T. Baird, *J. of Microscopy*, 108(3) (1976) 261-275.

J. R. Fryer, *Acta Cryst.* A35 (1979) 327-332.

M. Ashida, N. Uyeda & E. Suito, *Bulletin of the Chemical Society of Japan*, 39(12) (1966) 2616-2624.

Y. Saito and M. Shiojiri, *J. of Crystal Growth*, 67 (1984) 91.

Y. Saito, *Applications of Surf. Sci.* 22/23 (1985) 574-581.

A. Mcpherson and P. J. Schlichto, *J. Cryst. Growth*, 85 (1987) 206.

T. Kanetake et al., Applied Physics Letters, vol. 51, No. 23, Dec. 7, 1987, pp. 1957-1959.

ORGANIC THIN FILM CONTROLLED MOLECULAR EPITAXY

This is a division of application Ser. No. 07/219,004, filed Jul. 13, 1988, now U.S. Pat. No. 4,940,854.

FIELD OF THE INVENTION

The present invention relates to layered structures in which crystallites of a first and successive thin layers of organic compounds on a support can have controlled configurations. In another aspect, processes for preparing the layered structures of the invention are disclosed. The layered structures are useful in technologies such as photoconductive imaging, photovoltaic and energy conversion and control devices, information storage media, chemical sensors and integrated optical processing systems for communications and detection.

BACKGROUND OF THE INVENTION

Epitaxial growth of inorganic materials onto other inorganic substrates is an extremely important field of modern materials science which involves the nucleating and growing of atoms and molecules into highly structured lattices on top of other crystalline lattices. The most important and commonly used means to form thin layers of certain crystalline materials is by growth from the vapor phase (for more on epitaxy and vapor phase see "Recent Developments in the Theory of Epitaxy," J.H. van der Merwe, in *Chemistry and Physics of Solid Surfaces V*, Eds. R. Vanselow and R. Howe, Springer-verlag. N.Y. (1984), p. 365-401, and "Growth from the Vapor Phase," in *Modern Theory of Crystal Growth I*, Ed. A. A. Chernov, Springer-Verlag. N.Y. 1983, Chpt. 8.

Epitaxial growth of large anisotropic organic molecules on inorganic substrates is also known. Vapor deposited phthalocyanine thin layers deposited onto graphite, alkali halide, and muscovite single crystals are reported (see N. Uyeda, T. Kobayashi, E. Suito, Y. Harada and M. Watanabe, J. Appl. Phys. 43(12) (1972) 5181; M. Ashida, Bulletin of the Chemical Society of Japan 39(12), (1966) 2625-2631 and 2632-2638; H. Saijo, T. Kobayashi and N. Uyeda, J. of Crystal Growth 40 (1977) 118-124; M. Ashida, N. Uyeda and E. Suito, J. of Crystal Growth 8 (1971) 45-56; Y. Murata, J. R. Fryer and T. Baird, J. of Microscopy, 108(3) (1976) 261-275; J. R. Fryer, Acta Cryst. A35 (1979) 327-332; M. Ashida, N. Uyeda and E. Suito, Bulletin of the Chemical Society of Japan 39(12) (1966) 2616-2624; Y. Saito and M. Shiojiri, J. of Crystal Growth 67 (1984) 91; and Y. Saito, Applications of Surf. Sci. 22/23(1985) 574-581.

Epitaxial growth and polymerization of synthetic and biopolymers onto alkali-halide substrates, from solution, melt, and vapor phases is also known. Recently described is the use of inorganic minerals as substrates to control the vapor transport and solution growth habits of protein crystals (see A. Mcpherson and P. J. Schlichto, J. Cryst. Growth 85 (1988) 206). U.S. Pat. No. 4,016,331 discloses epitaxially growing, by vapor phase methods, thin organic layers onto substrates of thin sheets or webs of thermoplastic polymeric materials which have been made highly oriented in the plane of the sheet by stretching and heating or mechanical rubbing in one direction.

Shortcomings of inorganic single crystals as substrates for epitaxial growth are many. For example, the number and types of single crystals for proper registry for coating is limited; the crystal surface may be reactive, oxide coated, and/or contain adsorbed water molecules; the substrate may be opaque to light, have undesirable electronic and/or thermal properties and the like.

Many of the shortcomings of inorganic single crystals as epitaxial substrates apply as well to those of stretched and/or heated organic web substrates, which, by their nature, induce a fiber like anisotropy in the plane of the film that may be undesirable (see U.S. Pat. No. 4,016,331).

SUMMARY OF THE INVENTION

Briefly, the present invention provides a layered structure comprising a substrate and having coated on at least a portion of at least one surface thereof a first layer (sometimes referred to herein as "seed layer") comprising a crystalline uniaxially oriented organic compound and a second layer of crystalline uniaxially oriented organic compound coated over the first layer wherein the second layer is epitaxially controlled by the crystallite configuration of the first layer.

The first and second layers comprising an organic compound can be continuous or discontinuous, as for example in a patterned, layer. The layers can be the same or different organic compound.

In another aspect, the process of the present invention provides a layered structure in which at least two thin layers of different organic compounds are vapor-deposited sequentially on a support to provide organic layers of controlled crystalline epitaxy.

This invention in a further aspect teaches a closed cell vapor transport method, which has advantages over vacuum sublimation deposition, for depositing and obtaining specifically oriented organic thin layers without control of the substrate temperature.

The present invention provides an advantage over the art in that it discloses a means to control or alter the orientational growth direction or polymorph type of a vapor deposited organic layer which can use an arbitrary substrate, such as glass or an ordinary noncrystalline metal. This advantage is demonstrated by the present invention which teaches that thin oriented organic seed layers, obtained initially for example by vacuum sublimation onto an arbitrary substrate at controlled substrate temperatures, can completely alter the growth direction of another organic layer deposited onto the seed layer, according to the orientation chosen for that seed layer.

This invention finds utility in technologies such as photoconductive imaging, photovoltaic and energy conversion and control devices, information storage media, chemical sensors and integrated optical processing systems for communications and detection.

In this application:

"epitaxy" means the ordered growth of an overcoated material on the surface of a coated substrate, such that the crystalline properties and orientation of the overcoated material mimics the orientation and crystallinity of the coated substrate;

"physical vapor transport (PVT)" means the process whereby a material is sublimed under an ambient of a buffer gas, allowed to advect (by diffusion and convection) along a thermal gradient from a warmer to a cooler surface and there recondense as a thin film; the pressure of the buffer gas can be in the range of 0.001 Torr to 10,000 Torr;

"closed chamber PVT" means that the PVT process takes place within an evacuated, sealed chamber, also referred to as an ampoule, which is closed to the transport of all material into or out of the chamber during the processing;

"oriented seed film" means a thin organic layer, between about 0.5 nanometers and 1000 nanometers thick, in which substantially all of the molecules comprising the layer are arranged in a common orientation;

"orthogonal" and "normal" mean perpendicular;

"crystallites" means small single crystalline regions or domains of material which together comprise the layer;

"substrate" means those materials which will maintain their integrity at the temperatures and vacuums imposed upon them during the deposition of thin organic coatings and overcoatings onto the substrate;

"coating" or "layer" or "film" means an organic material (element or compound), usually as a thin film or layer that is put in intimate contact with (covers) at least a portion of at least one surface of a substrate, but preferably covers at least one surface of the substrate;

"overcoating" or "overcoated layer" means a crystalline organic material which is put in intimate contact with at least a portion of a coating or previously deposited layer. Where a coating is patterned, the overcoating will cover at least a portion of at least one surface of a substrate;

"uniaxial" layer means that the layer material properties are anisotropic with respect to one direction in the material, but isotropic within the plane perpendicular (orthogonal) to the uniaxial direction;

"anisotropic" means having different properties in different directions;

"isotropic" means having the same properties in all directions;

"b-axis" means the crystallographic axis of the material crystal structure is parallel to the stacking axis of substantially planar shaped molecules, conventionally taken as the smallest of the a,b,c unit cell lattice vectors defining the crystalline lattice;

"standing b-axis" means that the b-axis is inclined at an angle equal to or less than approximately 30° with respect to the perpendicular direction to the substrate plane;

"parallel b-axis" means that the b-axis is parallel to the substrate plane;

"isoepitaxy" means the case of epitaxy where the seed layer and organic overcoated layer have isomorphic crystal structures;

"homoepitaxy" means the case where the layer and overcoated layer are of the same material;

"mask" means a device used to shield selected portions of a substrate during a deposition process; and "substantially" means at least 90 percent, preferably 95 percent.

BRIEF DESCRIPTION OF THE DRAWING

FIG. 3 is a schematic illustration of a layer of oriented planar molecules in a second parallel b-axis configuration on a substrate.

DETAILED DESCRIPTION OF THE INVENTION

Figure 1A:
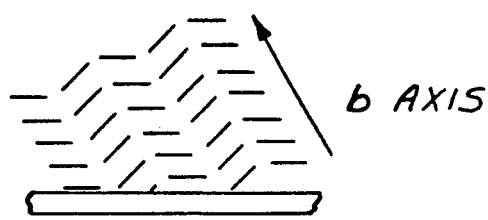
In FIG. 1A the molecules are seen in a side view, their edges represented by a line segment, while in FIG. 1B they are seen in a top view on the substrate.

In a preferred embodiment, the present invention provides a layered structure comprising a vapor deposited organic layer comprising substantially planar molecules, where the average molecular stacking or b-axis orientation can be varied between the limits of 0 degrees and less than 90 degrees with respect to the surface normal (perpendicular) direction wherein the organic layer molecules are deposited onto and mimic the orientation of a seed layer which is itself an organic thin layer having been previously deposited and oriented by means known in the art, the seed layer being coated on a substrate.

This invention teaches that oriented organic seed layers can control the growth direction of another organic layer epitaxially overcoated onto the seed layer, according to the orientation chosen for that seed layer. Orientation of the seed layer is defined by the average direction of the crystalline b-axis relative to the substrate plane, the seed layer being coated from the vapor phase onto an arbitrary substrate at controlled substrate temperatures and deposition rates.

Deposition of organic compounds (for a seed layer) from the vapor phase can be achieved by any method known in the art including vacuum sublimation, closed or open chamber physical vapor transport, chemical vapor transport, chemical vapor deposition, and metal-organic chemical vapor deposition.

A preferred method for deposition of organic layers onto a substrate is closed chamber physical vapor transport (PVT) in which organic material is sublimed into a buffer (carrier) gas of low pressure (0.001 to 10,000 Torr) and allowed to diffuse and convect along a temperature gradient to a cooler surface where the organic molecules recondense to form the coated layer. This invention teaches use of the PVT method to deposit and orient organic materials on a substrate. When the PVT process is used to deposit a seed layer the average b-axis orientation of organic molecules can be in the range of 0 and less than 90 degrees, preferably in the range of 0 and 75 degrees, more preferably in the range of 0 and 60 degrees, most preferably in the range of 0 and 30 degrees with respect to the surface normal direction of the substrate.

Another preferred method of orienting a seed layer when using deposition by vacuum sublimation has been taught in the art, see M. K. Debe, J. Appl. Phys. 55(9) 3354 (1984), and 62(4), 1546 (1987), and depends upon the substrate temperature. For organic compounds generally a special temperature to achieve this standing b-axis orientation can be in the range of 0.31 to 0.35 times the boiling point of the organic compound in degrees Kelvin and has been observed to endow the layer with special physical properties. For phthalocyanines the temperature of the substrate to achieve the special property of a standing b-axis configuration is in the range of 0° to 15° C. When the temperature of a substrate is outside these ranges, deposition by vacuum sublimation results in a parallel b-axis oriented seed layer. The present invention teaches that when a crystalline organic layer is coated from the vapor phase over a seed layer its crystallographic structure will be epitaxial with the seed layer.

As noted above there are two preferred coating methods (i.e., 1) PVT and 2) vacuum sublimation onto a substrate in a specific temperature range) that can lead to seed layers and subsequently coated organic layers having a b-axis orientation on average in the range of 0 to less than 90 degrees with respect to the surface normal direction. Coating of a seed organic layer from the vapor phase onto a substrate not in the specified temperature range can provide the seed layer, and subsequently coated organic layers, having a b-axis orientation on average parallel to the substrate surface.

Control of the crystallographic orientation of a seed layer in a b-axis orientation in the range of 0 to less than 90 degrees with respect to the normal surface direction can be achieved by varying the angle of incidence of vacuum sublimed and condensing molecules on a substrate as is taught in Shi Zurong and Cai Zhongfu, Kexue Tongbao, Vol. 29, (2) (1984) p. 280. Controlling the rate of deposition of the seed layer can also affect the crystallinity and b-axis orientation, see A. Taomoto et al, Nippon Kagaku Kaishi, Vol. 11 (1987) p. 2025.

This invention can provide articles comprising a substrate, and overlying the substrate is deposited a first organic layer, which layer can act as an oriented seed layer onto which is epitaxially deposited a second organic layer. The seed layer can be used to epitaxially control the growth of the second organic overcoating. A multicoated article can be provided in which an epitaxially controlled previously coated organic layer becomes the seed coating for a subsequent epitaxially deposited thin organic layer.

The PVT process of the invention provides an article comprising a substrate and a thin layer of organic material coated thereon wherein the the b-axis of the highly uniaxially oriented organic layer is substantially oriented having an average b-axis orientation from 0 to less than 30 degrees with respect to the surface normal compared to that of a layer of organic material obtained by vacuum sublimation wherein the b-axis is substantially parallel to the substrate, whether a seed layer is present or absent.

Because the organic layers can be continuous or discontinuous, this invention can provide a patterned article wherein at least a portion of the surface of the substrate is first masked to provide a patterned substrate having masked and unmasked surface areas, and onto at least a portion of the patterned substrate is then deposited an oriented first (seed) coating to provide a patterned layer, onto which is next epitaxially deposited, without the mask present, a second thin organic layer overcoating to provide a patterned overcoating of the resultant patterned article wherein the b-axis of the organic overcoating in the masked areas has one orientation and the b-axis of the organic overcoating in the unmasked areas has the orthogonal orientation. The overcoated layer will have different refractive indices in the two types of patterned areas and can be useful as an optical circuit.

This invention can provide a multicoated, patterned article wherein a first epitaxially controlled patterned organic layer becomes the patterned seed layer for a subsequent epitaxially deposited and resultant patterned second organic layer.

In one embodiment, this invention provides a process for preparing articles of this invention comprising the steps of:

(1) providing a substrate, (2) depositing from the vapor phase and crystallographically uniaxially orienting an organic seed layer onto the substrate, (3) depositing from the vapor phase a second organic layer (which may be the same or a different organic compound) onto the seed layer wherein the orientation and crystallinity of the second layer is epitaxially controlled by the seed layer.

The substrate temperature during the deposition of the seed layer by vacuum deposition, for example, may have any value necessary to obtain the desired seed layer orientation. Preferred substrate temperatures lie in the range of −50° C. to 250° C. and special physical properties can be obtained in the range of 0.31 to 0.35 times the boiling point in °K. for organic compounds generally and 0° to 15° C. for phthalocyanines.

In a second embodiment, this invention can provide a process for providing multicoated articles comprising the steps of:

(a) providing a substrate, (b) depositing from the vapor phase and crystallographically uniaxially orienting an organic seed layer onto the substrate, (c) depositing from the vapor phase a second thin organic layer onto the seed layer to provide a coated article wherein the orientation and crystallinity of the second layer is epitaxially controlled by said seed layer, (d) depositing from the vapor phase additional thin organic layers onto the resulting coated article of step(c) to provide a multilayered article wherein the additional layers are epitaxial with the seed and second layers.

In a third embodiment, this invention can provide a process for making patterned articles of this invention comprising the steps of:

(a) providing a substrate, (b) masking at least a portion of a surface of the substrate to provide a masked patterned substrate, (c) depositing from the vapor phase and crystallographically and uniaxially orienting a first organic seed layer onto the masked patterned substrate to provide an oriented patterned seed layer, and (d) epitaxially depositing from the vapor phase at least one additional crystalline organic layer onto the oriented patterned seed layer without the mask present, to provide the patterned article having epitaxially oriented layers.

In another embodiment, this invention provides a closed chamber physical vapor transport process to provide uniaxially oriented thin organic layers, whose orientation on average is a standing b-axis orientation even when the substrate temperature does not have a value 0.31 to 0.35 times the boiling of the organic compound in degrees Kelvin, or for phthalocyanines the substrate temperature is outside the 0° to 15° C. range whether or not there is a seed layer present, comprising the steps of:

(a) providing a substrate and an organic source material, (b) providing an evacuable, sealable chamber having two ends, the chamber having a means for vacuum outgassing the interior, a means for introducing a buffer gas, a means for providing a temperature gradient between the two ends, the temperature of the first end being hotter than that of the second end, (c) introducing the substrate into the chamber, and positioning it at the second end, (d) introducing the source material into the chamber and positioning it near the first end, (e) outgassing said chamber to a pressure in the range of $10^{-6}$ to $10^{-10}$ Torr, and optionally introducing a buffer gas into the chamber at a pressure between 0.001 Torr and 10,000 Torr.

(f) applying heat to the chamber such that the first end approaches 400° C. or is sufficient to sublime the source material, while cooling the second end to a temperature in the range of 20° C. and 100° C., (g) continuing such heating for a period of time sufficient to deposit the desired coating layer if source material at a thickness onto the substrate sufficient to provide a uniaxially oriented organic coated layer whose crystallographic molecular stacking axis is substantially inclined in the range of 0 degrees to less than 90 degrees with respect to the surface normal direction of the substrate, and (h) applying at least one additional organic coating over said coated substrate by depositing from the vapor phase at least one additional layer of crystalline organic material to provide a layered structure wherein the additionally coated layers are epitaxial with said coated layer of source material.

The means for outgassing the chamber can include mechanical roughing pump, sorption pump, ion pump, oryo pump, diffusion pump, turbo molecular pump, etc., and combinations thereof. Means for providing a temperature gradient can include heating the first end by use of a concentric electric heater, and/or extracting heat from second end as by a heat pipe or a thermoelectric cooler. Means for introducing a buffer gas includes any means known in the art such as through a leak valve, diffusion through a porous membrane, etc. Means for securing the substrate and source material can be any means known in the art such as fastening by spot welding, brazing, etc.

Substrates that are useful in the practice of this invention can be selected from those materials which will maintain their integrity at the temperatures and vacuums imposed upon them during coating and overcoating operations. The substrate can be flexible or rigid, planar or non-planar, convex, concave, aspheric, or combinations thereof. Materials such as metals and ceramics (including metal oxides and glass), or their mixtures can be used as substrates. Organic materials (including polymers) able to withstand coating and overcoating vacuums and temperatures can also be used, e.g. polyimides, polycarbonates, polyalkylenes, polyesters, polyacrylates (polyacrylic acid esters), and the like.

Representative examples of metals useful as substrates for this invention include aluminum, cobalt, copper, molybdenum, nickel, platinum, tantalum, and metal alloys. The varying nature of metals or metal oxides does not appear to bring about observable differences in the final composite, i.e., both the pure metals and metal oxide coatings serve as inert substrates. Metal substrates can thus be exposed to the atmosphere before coating operations without adverse affects. The substrate can have any suitable thickness and the thickness of the substrate can vary.

Organic compounds that are useful for preparing the coated and overcoated layers of this invention include compounds comprised of substantially planar molecules comprising chains or rings, preferably rings, over which pi-electron density is extensively delocalized. These compounds include polynuclear aromatic hydrocarbons, such as perylenes, and heterocyclic aromatic compounds, such as porphyrins and phthalocyanines such as phthalocyanine ($H_2Pc$) and metal phthalocyanines such as copper phthalocyanine (CuPc). Typically, the molecules pack into crystalline structures in a "herringbone" fashion.

Compounds that are preferred for this invention can be broadly classified as polynuclear aromatic hydrocarbons and heterocyclic compounds. Polynuclear aromatic compounds are described in Morrison and Boyd, *Organic Chemistry*, Third Edition, Allyn and Bacon, Inc. (Boston: 1974), Chapter 30, and heterocyclic aromatic compounds are described in Morrison and Boyd, supra, Chapter 31. Among the classes of polynuclear aromatic hydrocarbons preferred for this invention are naphthalenes, phenanthrenes, perylenes, anthracenes, coronenes, pyrenes, and derivatives of the compounds in the aforementioned classes. A preferred organic material is commercially available perylene red pigment, N,N'-di(3,5-xylyl)perylene-3,4:9,10 bis(dicarboximide), hereinafter referred to as perylene red. Among the classes of heterocyclic aromatic compounds, wherein the heteroatoms can be S, N, O, preferred for this invention are phthalocyanines, porphyrins, carbazoles, purines, pterins, and derivatives of the compounds in the aforementioned classes. Representative examples of phthalocyanines especially useful for this invention are phthalocyanine ($H_2Pc$) and its metal complexes, e.g. copper phthalocyanine and vanadyl phthalocyanine. A representative example of porphyrins useful for this invention is porphyrin. The organic materials are preferably capable of forming a film of a thickness of at least several tens of Angstroms to a few thousand Angstroms.

The thickness of the seed layer may be any value in the range of the thickness of a single layer of molecules (about 0.5 nm) up to the thickness where the seed layer begins to take on the properties of a bulk material, or about 1000 nanometers. The preferred seed layer thickness is in the range of 1 nanometer to 100 nanometers.

The organic overcoated layer thickness may be any value in the range from a single molecular layer thickness (about 0.5 nm) up to the thickness where the overcoated layer takes on the properties of a bulk solid, or up to about 1 to 10 micrometers. The preferred overcoated layer thickness depends on the intended application. For example, for optical waveguide applications a preferred thickness would be about two optical wavelengths or about 1 to 3 micrometers. For an optical interference filter device comprised of multilayers of organic layers, the preferred thickness can be one-fourth of an optical wavelength or about 0.5 to 0.7 micrometers.

The buffer gases useful in closed chamber PVT are inert gases such as the nobel gases He, Ar, Xe and other non-reactive gases such as nitrogen, CO, $CO_2$, $H_2$, or low molecular weight fluorocarbon gases. The buffer gas useful pressures lie in the range of 0.001 to 10,000 Torr, preferably in the range of 0.1 to 1000 Torr. The useful temperature range of the substrate is any temperature below the temperature of the hotter end, preferably less than 99% but more than 25% of the hotter end temperature expressed in degrees Kelvin.

Figure 1B:
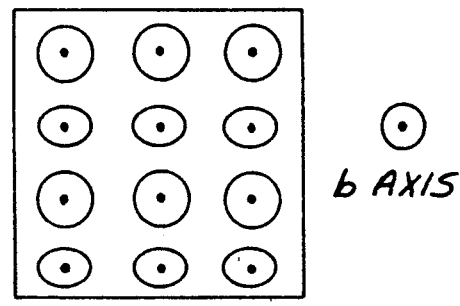
FIG. 1 is a schematic illustration of a layer of oriented planar molecules in a standing b-axis configuration on a substrate.
Figure 2A:
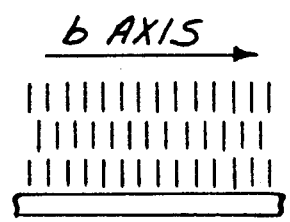
In FIG. 2A the molecules are seen in one possible side view while in FIG. 2B they are seen in the corresponding top view on the substrate.
Figure 2B:
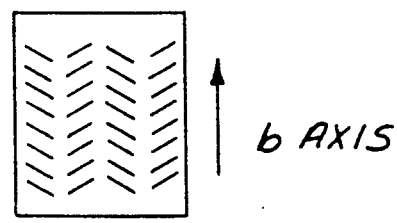
FIG. 2 is a schematic illustration of a layer of oriented planar molecules in a first parallel b-axis configuration on a substrate.
Figure 3A:
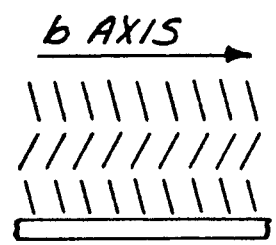
In FIG. 3A the molecules are seen in a second possible side view.
Figure 3B:
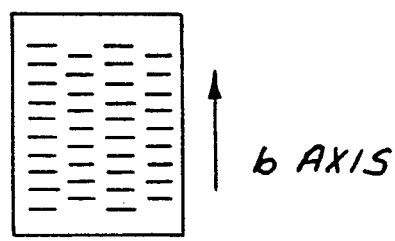
In FIG. 3B they are seen in the corresponding top view on the substrate.

Discussing the Drawing in detail, FIGS. 1, 2, and 3 depict oriented coatings of substantially planar organic molecules deposited onto a supporting substrate. When viewed from the side, such a molecule is represented by a short straight line segment. When viewed face-on, the molecule is represented by a circle, or ellipse if tilted. In FIG. 1A the sideview shows the herringbone stacks of molecules in a "standing" b-axis configuration. The angle between the b-axis and the surface normal direction may vary between 0 and about 30 to 35 degrees. In FIGS. 2A and 3A side views show two orthogonal molecule arrangements for a parallel b-axis configuration. In both FIGS. 1 and 2 the plan view of the molecular arrangements projected onto the substrate plane are designated 1B, 2B, and 3B.

These molecular orientations are typical of the metal-containing and metal-free phthalocyanine materials when formed into thin coatings by deposition using vacuum sublimation methods. It is known in the art that control of the substrate temperature is one of the most important deposition parameters which determines the type of orientation produced in the organic layer. It is summarized in K. F. Schoch, J. Greggi and T. A. Temofonte, J. Vac. Sci. Technol. A, Vol. 6(1), (1988) page 157, for example, that above a substrate temperature of 15° C., or below a temperature of 0° C., the phthalocyanine compounds form the parallel b-axis orientations, while between about 0° and 15° C., a standing b-axis orientation is obtained.

Figure 4A:
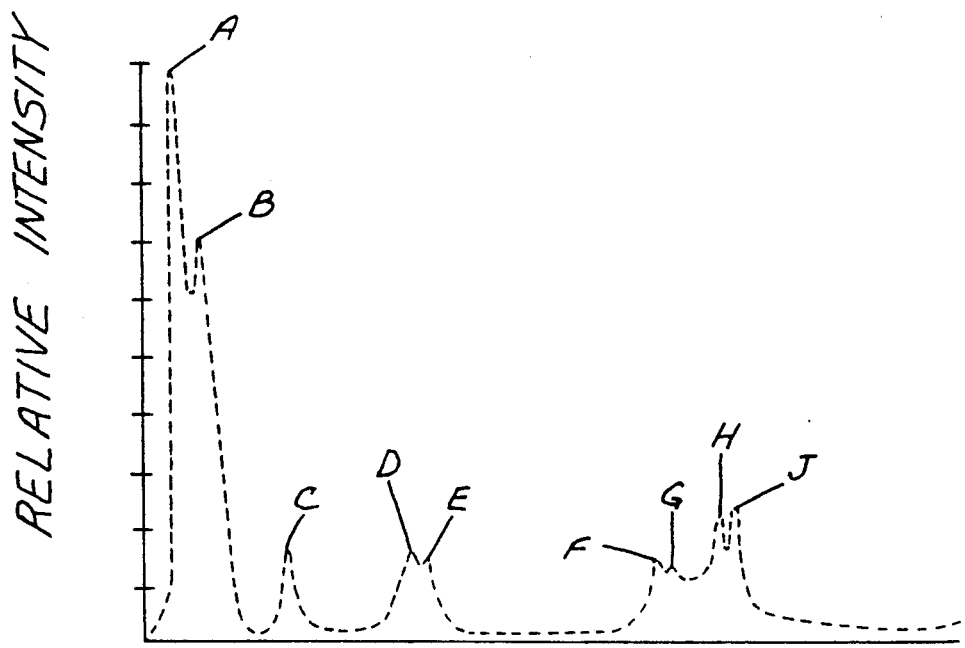
FIG. 4A shows an X-ray powder diffraction spectrum of alpha-copper phthalocyanine (CuPc), prepared as disclosed in U.S. Pat. No. 3,051,721 (comparative).
Figure 4B:
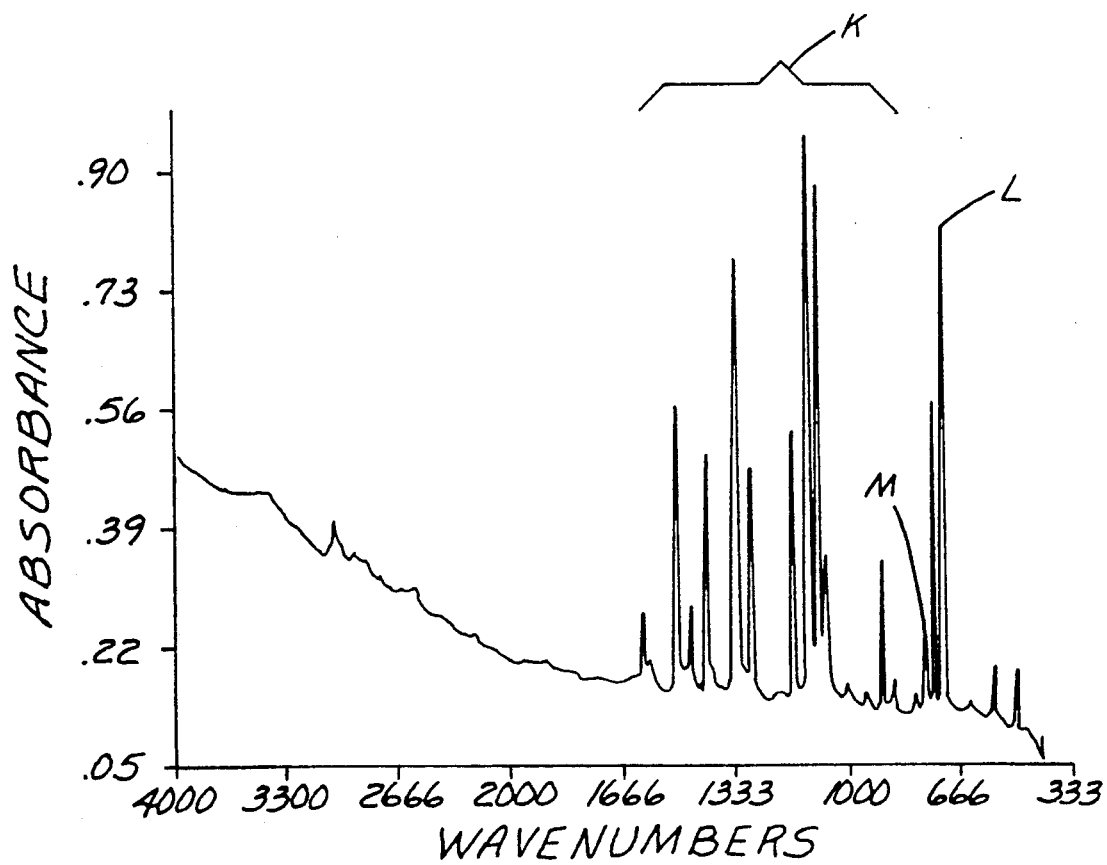
FIG. 4B shows A powder infrared absorption spectrum of alpha-CuPc (comparative).

Orientation of the b-axis in such layers can be determined by grazing incidence X-ray diffraction or GIX, and reflection absorption infrared spectroscopy, or RAIR. FIGS. 4A and 4B respectively show X-ray diffraction and infrared absorption curves from bulk powdered samples of alpha CuPc in which there is no preferential orientation. The peak positions and intensities in each curve are representative of molecules in totally randomized orientations. The peak positions also indicate the kind of crystalline polymorph present in the layer.

In FIG. 4A, the interplanar spacings in Angstroms are:

| A | 13.0 | E | 5.49 |
|---|------|---|------|
| B | 12.1 | F | 3.72 |
| C | 8.85 | G | 3.57 |
| D | 5.70 | H | 3.35 |
|   |      | J | 3.24 |

In FIG. 4B, region K represents in-plane absorbance bands whereas M and L represent out-of-plane absorbance bands.

Figure 5A:
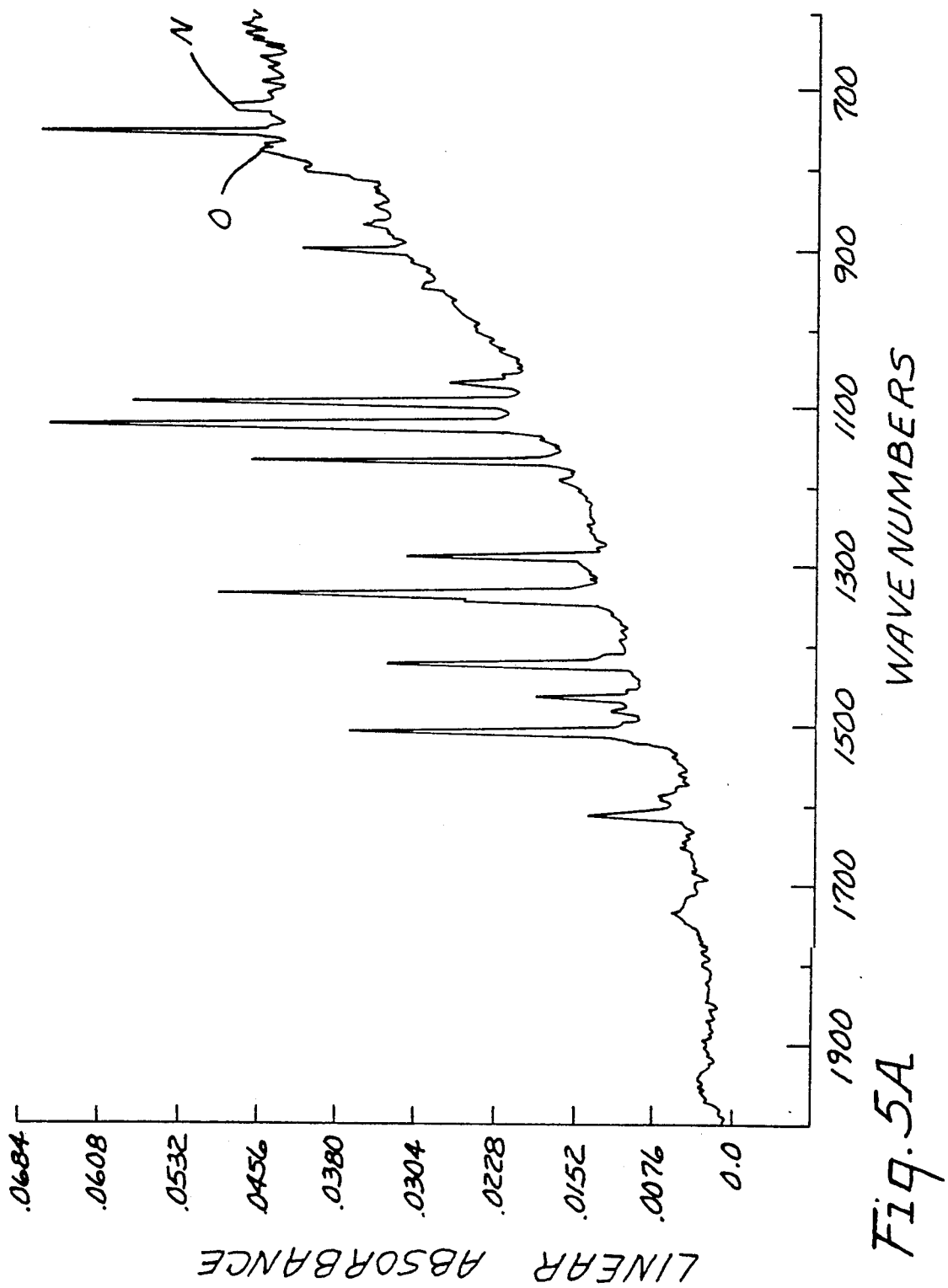
FIG. 5A shows a reflection absorption infrared (RAIR) spectrum of a CuPc thin layer coated by vacuum sublimation deposition at 69° C. onto bare copper (comparative).

When these techniques are applied to thin layers at near grazing angles of incidence, any preferential orienting of the molecules in the layer becomes evident in the relative intensities of the GIX or RAIR spectra. In particular these techniques are very useful in distinguishing between different b-axis orientations such as shown in FIGS. 1, 2, and 3. For example, FIG. 5A shows the RAIR spectrum from a layer of CuPc coated by vacuum sublimation onto a copper substrate at a temperature of 69° C. Features N and O show absorbance peaks at 722 and 770 $cm^{-1}$ respectively. Comparing this spectrum with that of FIG. 4B shows that certain infrared (IR) absorption bands have been significantly attenuated. These attenuated bands, most notably at 722 and 770 $cm^{-1}$ are produced by dipole transition moments which are perpendicular to those of the other bands. These attenuated bands' transition moments are perpendicular to the plane of the CuPc molecule and are therefore called out-of-plane bands. The bands which are not attenuated are called in-plane bands since the transition moment lies parallel to the molecular plane. Because of the optical electric field configuration at the substrate surface under the conditions of application of RAIR, this means that the CuPc molecules are oriented substantially edge-on relative to the substrate plane. That is, the molecules are predominantly oriented in a parallel b-axis configuration similar to FIG. 2A.

Figure 5B:
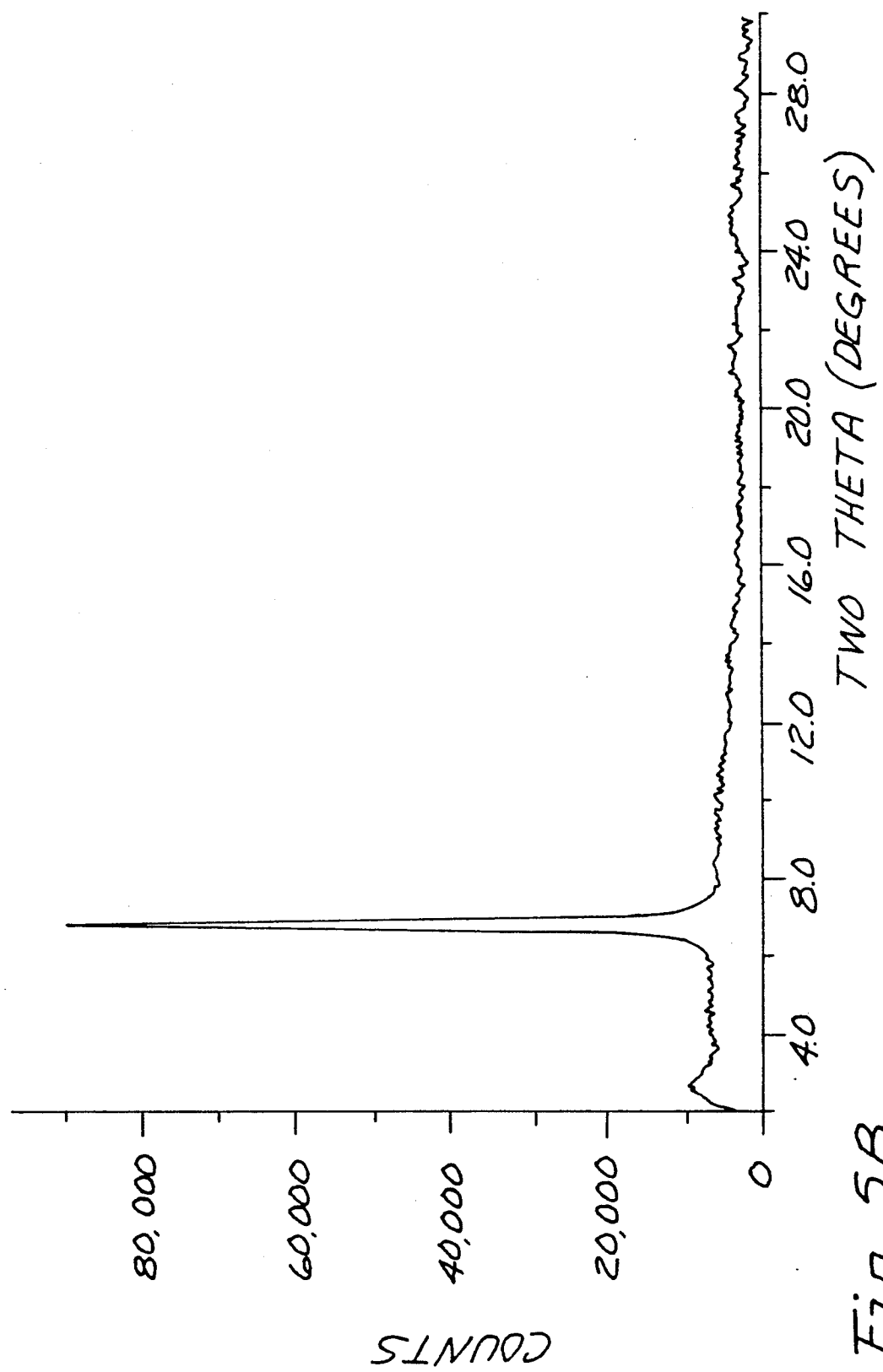
FIG. 5B shows a grazing incidence X-ray diffraction (GIX) curve from the CuPc layer coating of FIG. 5A (comparative).

Similarly, GIX is applied to thin layers in such a geometry that only diffraction from sets of lattice planes which lie parallel to the substrate occurs. FIG. 5B shows the GIX curve from the same sample which produced FIG. 5A. Comparing FIG. 5B with FIG. 4A shows clearly that only one set of lattice planes are parallel to the substrate since only one diffraction peak is seen. From the value of the d-spacing, or spacing between the lattice planes, obtained from the position of the diffraction peak in FIG. 5B, it is clear that the b-axis is in the parallel configuration, just as implied by the RAIR spectrum in FIG. 5A.

FIGS. 5A and 5B show, in agreement with the known art, at substrate temperatures above 15° C., the phthalocyanine molecules form a parallel b-axis oriented layer when vacuum sublimation-coated onto substrates which do not have an organic seed layer coating.

In this invention we teach that the orientation of such layers comprised of substantially planar molecules, when coated onto a substrate from the vapor phase, can be controlled regardless of the substrate temperature, if an organic seed layer is first coated onto the substrate so that the seed layer epitaxially controls the orientation of the overcoated organic layer.

This can be most clearly demonstrated by using as an oriented seed layer, a thin layer of a phthalocyanine which was vacuum sublimation coated onto a substrate maintained at a temperature in the range of 0° to 15° C. As described above, this will produce a layer oriented with a standing b-axis. Thickness of the layer can be at least about one nanometer and thicker, and preferably, the layer thickness can have any value from about 10 nanometer to about 100 nanometers. This coated substrate is then warmed above room temperature and subsequently overcoated with a vapor deposited layer of another organic material, for example another kind of phthalocyanine. For the description of this invention it is convenient to use metal-free phthalocyanine for the seed layer and a metal phthalocyanine for the overcoated organic layer because their GIX and RAIR spectra can easily be distinguished to show the epitaxially induced orientation of the overcoated film.

Figure 6A:
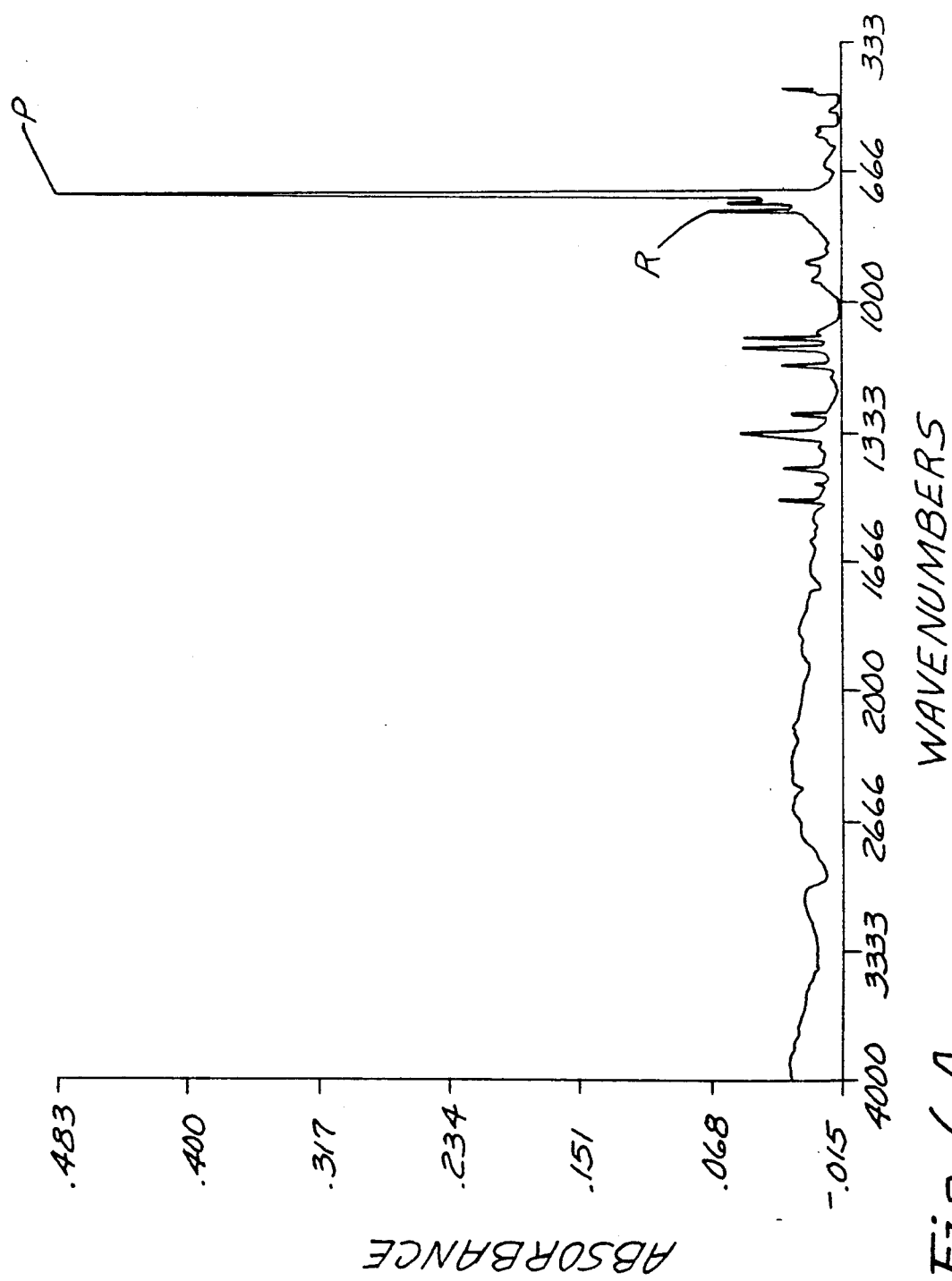
FIG. 6A shows a RAIR spectrum of a CuPc thin layer coated by vacuum vapor deposition onto an oriented seed layer of metal-free phthalocyanine layer on a copper substrate held at 70° C.

FIG. 6A shows the RAIR spectrum from the overcoated layer of copper phthalocyanine deposited, onto a metal free phthalocyanine-coated substrate, at a temperature near 70° C. As discussed above, without the seed layer present, the CuPc layer would be oriented in a parallel b-axis configuration. However, FIG. 6A clearly shows the CuPc molecules are oriented in a standing b-axis orientation since now the out-of-plane bands, P and R, are much stronger than the in-plane bands. Similarly, FIG. 6B shows the GIX curve from the CuPc overlayer contains only peaks produced by lattice planes stacked along the b-axis, implying a standing b-axis orientation only.

Figure 6B:
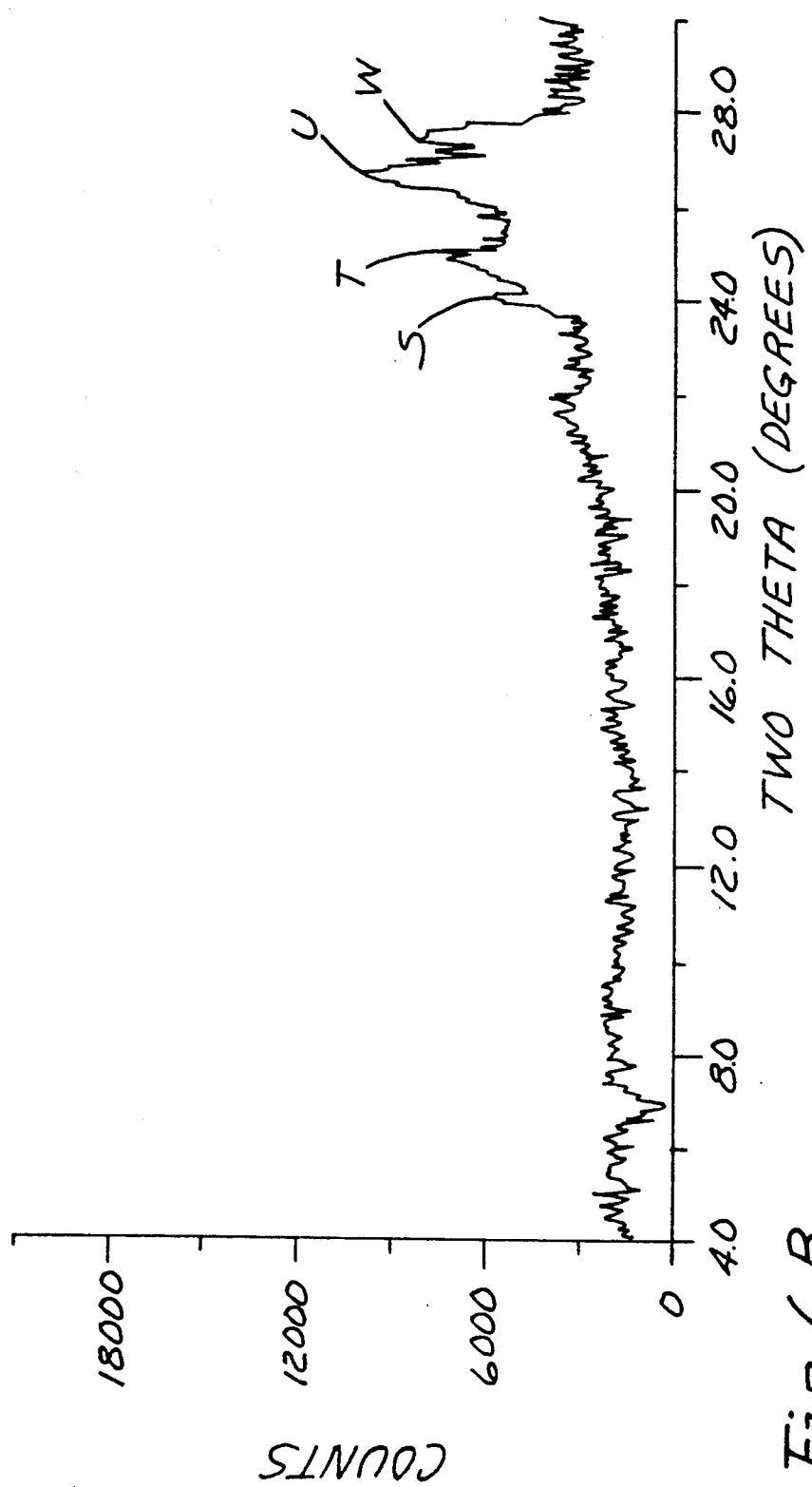
FIG. 6B shows a GIX curve from the CuPc layer of FIG. 6A.

FIGS. 6A and 6B show the oriented seed layer of metal free phthalocyanine has induced the overcoated CuPc layer to epitaxially orient in a manner opposite to its natural tendency when the seed layer is not present.

Using the method of Debe (J. Appl. Phys. 55(9), 3354 (1984) and 62(4),1546 (1987)) it can be deduced from the relative intensities of the out-of-plane to the in-plane bands of FIG. 6A that at least 90% of the CuPc molecular crystalline domains are oriented with their b-axis inclined less than about 30 degrees with respect to the substrate normal direction. This can be considered the opposite orientation extreme to what can be achieved by depositing the CuPc overlayer in the parallel b-axis orientation at substrate temperatures above about 15° C., e.g. without the seed layer. Other seed layer orientations and crystal structures may provide organic overlayers to be epitaxially deposited with an average b-axis orientation intermediate between these two extremes at any arbitrary substrate temperature. This would produce an article of a vapor coated layer where the average molecular stacking axis orientation can be varied between the limits of 0 degrees and less than 90 degrees with respect to the surface normal direction without limits imposed on the substrate temperature.

The above description has used vacuum sublimation as the method of coating and overcoating. Closed chamber physical vapor transport is another process taught by this invention as a means to coat oriented seed layers and overcoat epitaxially oriented organic layers. The temperatures of the hotter end of the PVT chamber which are useful for this method are in the range of 30° C. to 500° C., being limited by an adequate source material vapor pressure at the low temperature and thermal decomposition of the organic at the high temperature.

As previously mentioned an epitaxially coated first organic layer can be used as the seed layer for a second overcoated organic layer. In this way multilayered structures of uniformly oriented organic layers may be obtained for use in optical, optoelectronic, photovoltaic and electronic devices and apparatuses.

Also, as mentioned above, seed layers can induce epitaxial orientation of subsequent layers to produce a patterned article. In such a case a mask having a desired pattern of openings, such as might be used to fabricate an array of interconnected areas, is used to shield the substrate during the deposition of the seed layer. This produces a coated substrate comprised of areas which are bare and areas which are coated with the seed layer according to the pattern of openings in the mask. If now the mask is removed and a second organic layer is overcoated onto the entire surface of the coated substrate, then the resulting article will be comprised of a pattern of areas in which the second organic overcoating has different b-axis orientations. In the areas of the substrate where the seed layer is present, the overcoating will be epitaxially oriented by the seed layer according to the orientation of the seed layer. In the areas of the substrate where the seed layer was prevented from depositing onto the substrate, the overcoated second organic layer will be oriented "naturally" according to the substrate temperature used. The overcoated layer will present different refractive indices in the resultant patterned area because of the two different types of b-axis orientations. Such a patterned device can be useful as an optical circuit.

This invention also finds utility in technology areas where the optical, electronic, and chemical properties of organic thin layers are a consequence of their intrinsic microstructure and its orientation relative to a substrate supporting the film. These include technologies such as photoconductive imaging, photovoltaic and energy conversion and control devices, information storage media, chemical sensors and integrated optical processing systems for communications and detection.

Objects and advantages of this invention are further illustrated by the following examples, but the particular materials and amounts thereof recited in these examples, as well as other conditions and details, should not be construed to unduly limit this invention.

EXAMPLES

All temperatures are reported in degrees Centigrade. Analytical techniques used to identify and characterize the morphology of the organic compounds and film epitaxy were selected from or combinations of infrared (IR)-, reflection- absorption infrared (RAIR)-, and grazing incidence x-ray diffraction (GIX).

EXAMPLE 1

Comparative

The following example describes the vacuum sublimation deposition of CuPc onto a bare copper, amorphous surface, which will cause the CuPc to be crystalline and oriented such that the b-axis is directed parallel to the plane of the film, referred to as the "natural" direction or orientation.

A 1.5 cm diameter by 3 mm thick copper disc was polished, cleaned and then sputter coated with a fresh layer of copper. Upon exposing the copper surface to the atmosphere, a natural air oxide formed on the disc surface which was used "as is" as an amorphous substrate. The copper disc was then placed in a diffusion-pumped vacuum bell-jar system and the latter evacuated to the low $10^{-6}$ Torr range. Commercial CuPc powder had been placed in an $Al_2O_3$ crucible supported by a conventional tungsten wire basket heater. The disc, 16 cm above the crucible, was attached to a copper thermal block for cooling and heating of the disc. The CuPc powder was gradually warmed in the vacuum and outgassed over a period of 1.5 hours. Simultaneously, heated water was passed through the thermal block to bring the copper disc substrate to a temperature of 69° C. The heating current was then increased to begin the sublimation which was followed with a quartz crystal deposition monitor. The total layer thickness of the CuPc deposited onto the bare Cu at an average rate of 200 Angstroms/min. and a substrate temperature of 69° C. was 1040 Angstroms (A). FIG. 5A shows the RAIR spectrum from the CuPc layer subsequent to the deposition. Comparison with the powder IR spectrum in FIG. 4B shows that the out-of-plane bands L, M are strongly attenuated with respect to the in-plane bands K, implying clearly that the CuPc molecular planes are substantially edge-on oriented on the copper substrate in a parallel b-axis configuration. FIG. 5B shows the GIX diffraction scan from the CuPc layer. Clearly, only one diffraction order is seen, corresponding to the 12.93 Angstrom spacing of the alpha-CuPc (200) planes. In this growth habit the b-axis is lying exactly parallel to the film plane such that only the (h00) (wherein h is a unit integer, i.e. +1, +2, +3 ...) planes of the crystallites are parallel to the surface. In this configuration the CuPc planes are nearly edge-on oriented, as the RAIR data suggest. Hence, CuPc vacuum sublimation deposited onto an amorphous surface held at approximately 70° C. yielded a highly parallel b-axis oriented film in which the alpha-CuPc grew with (200) planes of the monoclinic lattice parallel to the substrate. This configuration is referred to as the "natural" growth mode to distinguish it from the seed layer induced growth habit described below. Such a growth mode has also been reported by Komiyama et al. [Thin Solid Films, 151 L109-L110 (1987)] when CuPc was vacuum sublimation deposited at low rates onto amorphous quartz at substrate temperatures of 25° C. and 100° C.

EXAMPLE 2

The following example describes first, the coating of a seed layer, by vacuum sublimation deposition, of metal free phthalocyanine ($H_2Pc$) onto a cooled bare copper, amorphous surface; second, the overcoating of this highly anisotropically oriented seed layer with a layer of CuPc to provide an article wherein the overcoating of CuPc was oriented in a standing b-axis configuration, substantially orthogonal to the growth habit of CuPc (comparative) when the seed layer coating is absent.

In this example, a second copper disc platen was prepared as above, and installed in the same vacuum bell-jar system as in Example 1. The disc was then cooled to approximately 7° C. to 8° C. by passing ice water through the copper cooling block attached to the disc. While the platen was cooling, $H_2Pc$ powder was outgassed by slowly increasing the heating current supplied to the tungsten basket heater of the crucible containing the seed film material. After about two hours of such "soaking", the current was further increased to cause the $H_2Pc$ to sublime and deposit onto the cold copper disc platen mounted 16 cm above the crucible. The deposition was monitored with a quartz crystal oscillator to a total thickness of 1050 Angstroms at a mean rate of about 250 A/min. Under these conditions, with the substrate temperature at 5° to 10° C., the deposited $H_2Pc$ seed film was highly anisotropically oriented, as described by Debe [M. K. Debe, J. Appl. Phys. 55(9), 3354 (1984) and Erratum, J. Appl. Phys. 62(4), 1546 (1987)] in a standing b-axis configuration such that at least 90% of the $H_2Pc$ molecules were inclined on average 26.5 degrees with respect to the film plane.

The copper disc platen with its oriented seed layer was then heated to 70° C. by passing hot water through the thermal block attached to the platen. In the interim the $H_2Pc$ loaded crucible was replaced with a CuPc loaded crucible and the latter outgassed by the same "soaking" procedure as used for the seed layer deposition. Vacuum vapor deposition of the CuPc overlayer onto the $H_2Pc$ seed layer film proceeded at an average rate of about 500 A/min. to a total thickness of 2040 A. FIG. 6A shows the RAIR spectrum from just the CuPc overlayer. Comparison with the reference powder spectrum of FIG. 4B clearly shows the large relative enhancement of the out-of-plane bonds, P and R, and that the CuPc molecules were crystallized in the alpha-CuPc form and highly oriented in a standing b-axis configuration, just like the seed layer, and in stark contrast to the layer of FIG. 5A. FIG. 6B shows the GIX diffraction scan from the CuPc overlayer. Comparison with FIG. 4A shows that FIG. 6B fully supports the RAIR data in that only d-spacings of the alpha-CuPc W, U, T, S lattice planes are apparent. Specifically, there is no intensity in the (200) or (00-2) diffraction orders again proving a standing b-axis orientation, and contrasting with the layer of FIG. 5B. These results show that the CuPc overlayer of this example was oriented exactly orthogonal to its growth habit when the seed layer was absent, the case described above as "natural". Thus, the oriented organic seed layer has induced the isoepitaxy of the organic overlayer.

EXAMPLE 3

This example describes the closed chamber physical vapor transport (PVT) process (invention) for the preparation of an article having, on a copper substrate, a layer of uniaxially oriented CuPc in the standing b-axis configuration which is substantially orthogonal to that obtained by conventional vacuum sublimation deposition at the same temperature (comparative).

In this example it is shown for the process of closed chamber physical vapor transport (PVT), that highly uniaxially oriented films of CuPc were obtained for which the average b-axis orientation was orthogonal to those obtained by vacuum sublimation deposition with the same substrate temperature. For the present example, the vapor transport reactor described in U.S. Pat. No. 4,620,963 was used to deposit CuPc onto the same type of bare copper disc platen described in Example 1. Ampoules such as described in U.S. Pat. No. 4,620,963, wherein the ampoules were enclosed in a protective steel cell which allows for a thermally insulating vacuum environment, were each loaded with a prepurified 0.1 g pellet of CuPc and backfilled with a selected buffer gas before processing. Both nitrogen and xenon were used in different runs as the initial buffer gas, at levels of about 0.5 Torr with similar results. The final buffer gas composition within the ampoules was observed to be substantially different from the initial gas load, but substantially the same among all the different samples. Processing consisted of energizing the heater described in U.S. Pat. No. 4,620,963 to bring the hot end of the ampoule to a temperature of 400° C. over a period of approximately 35 minutes, holding that temperature to within 1 degree for 4 hours, and following with a natural cooling period.

In this example, another experimental parameter demonstrated was the orientation of the reactor cell in the gravitational field of the earth because the latter can induce buoyancy driven convection currents within the ampoule. Hence processing runs with both the ampoule hot-end-up and hot-end-down were made for both types of buffer gases.

Another variable demonstrated in this example is the ampoule wall temperature profile. This was varied by processing with different levels of gas partial pressures admitted to the cell interior, external to the ampoule, to affect the thermal coupling between the heater and the ampoule contained concentrically within it. In each case the copper disc substrate temperature was passively controlled by a heat pipe pressed against the back of the disc, and measured by a thermocouple embedded in a small hole in the back of the disc. In all cases the maximum substrate temperature lay within the range of 68° C. to 81° C.

The resulting thin (1000 to 2000 A) CuPc layers deposited onto the bare Cu platens were substantially the same in that the RAIR spectra appeared similar to that of FIG. 6A, showing the majority of the material in the films consisted of alpha-CuPc in the highly oriented standing b-axis form. The RAIR spectra showed the film was highly oriented such that the out-of-plane vibrational modes were strongly coupled to the IR optical field but the in-plane modes were not. The molecular planes were substantially oriented parallel to the copper substrate, despite the substrate temperature of about 70° C. This is in sharp contrast to the first half of Example 1 wherein it was demonstrated that vacuum sublimation depositing CuPc onto an amorphous copper substrate at 70° C. produced a "natural" orientation of the molecules such that they were primarily edge-on oriented with the crystal b-axis parallel to the surface. The data show that closed chamber PVT can be used to obtain highly oriented films of phthalocyanine compounds which have opposite growth habits from those obtainable by vacuum sublimation deposition.

EXAMPLE 4

This example describes, first, the coating by the vacuum sublimation of an oriented seed layer of CuPc, onto a bare copper substrate having an amorphous surface; and second, the epitaxially controlled overcoating by the PVT process of this highly anisotropically oriented seed layer with CuPc to provide an article wherein the overcoating of CuPc is oriented approximately orthogonal to the growth habit of CuPc (comparative) when the seed layer coating was absent.

In this example it is demonstrated for the process of closed chamber physical vapor transport that an oriented seed layer of CuPc can be used to epitaxially control the orientation of a PVT deposited CuPc overlayer. The resulting orientation was opposite to that obtained with PVT when no seed layer was used, as described in Example 3. Two different seed films of CuPc were first prepared by vacuum sublimation deposition on two copper disc platens simultaneously in the same manner as that described in Example 1 for a substrate temperature of 69° C. One such platen was stored as a reference to be used as described below, while the other was used for the PVT experiment. The RAIR spectrum from this seed film is identical to that shown in FIG. 5A, and the GIX scan to that shown in FIG. 5B. The b-axis of the CuPc crystallites comprising this seed layer was parallel to the substrate such that the (h00) planes were parallel to the surface. This seed layer coated platen was then installed into the PVT reactor ampoule described in Example 2, with xenon as the buffer gas. The ampoule was then processed for 4 hours at 400° C. exactly as described in Example 2, in a hot-end-up configuration. RAIR and GIX spectra from the resulting CuPC layer deposited by closed chamber PVT were then obtained by subtracting the reference platen's spectra from the compound layer's spectra. The compound layer refers to the combined CuPc seed layer and the PVT deposited layer.

The GIX scan of just the PVT deposited overlayer again showed that the crystalline component of the PVT deposited layer had the same orientation as the seed layer. The RAIR difference spectrum, representative of all the CuPc material in the layer, showed the out-of-plane bands had intensities much closer to those of the in plane bands, in contrast to FIG. 6A and more similar to FIG. 4B. The data showed that the PVT deposited CuPc molecular planes were not oriented in the standing b-axis configuration which was induced when no seed layer was used, as demonstrated in Example 3. The GIX scan showed that the CuPc seed layer caused the CuPc overlayer to be homoepitaxially deposited using physical vapor transport, in sharp contrast to the growth habit when no seed film was used.

Various modifications and alterations of this invention will become apparent to those skilled in the art without departing from the scope and spirit of this invention, and it should be understood that this invention is not to be unduly limited to the following illustrative embodiments set forth herein.

I claim:
1. A process comprising the steps of:
   (a) providing a substrate,
   (b) depositing from the vapor phase and crystallographically, uniaxially orienting a first organic seed layer onto at least one surface of the substrate,
   (c) depositing from the vapor phase a second organic layer onto the oriented seed layer to provide a layered structure wherein the second layer is epitaxial with the first layer,
   (d) optionally, depositing from the vapor phase at least one additional crystalline organic layer onto the deposited layers of the resulting layered structure to provide a multilayered article having epitaxially oriented layers.

2. The process according to claim 1 wherein said layers have a crystallographic molecular stacking axis inclined on average at an angle in the range of 0 to less than 90 degrees with respect to the surface normal direction of the substrate.

3. The process according to claim 1 wherein said layers have a crystallographic molecular stacking axis which on average is parallel to the substrate surface.

4. The process according to claim 2 wherein said seed layer is crystallographically uniaxially oriented in a physical vapor transport process.

5. The process according to claim 2 wherein said seed layer is crystallographically uniaxially oriented by means of a vacuum sublimation deposition process in which said substrate is maintained at a temperature having a value in the range of 0.31 to 0.35 times the boiling point in degrees Kelvin of the organic seed layer compound.

6. The process according to claim 2 wherein said seed layer is a phthalocyanine compound which was deposited onto said substrate in a vacuum sublimation process, wherein during which process said substrate was maintained at a temperature in the range of 0° to 15° C.

7. The process according to claim 3 wherein said seed layer is a phthalocyanine compound which was deposited onto said substrate in a vacuum sublimation process, wherein during which process said substrate was maintained at a temperature in the range of less than 0° C. and greater than 15° C.

8. A process comprising the steps of:
   (a) providing a substrate, (b) masking at least a portion of a surface of the substrate to provide a masked patterned substrate, (c) depositing from the vapor phase and crystallographically uniaxially orienting a first organic seed layer onto the masked patterned substrate to provide an oriented patterned seed layer, and epitaxially depositing from the vapor phase at least one additional crystalline organic layer onto the oriented patterned seed layer without the mask present, to provide the patterned article having epitaxially oriented layers.

9. A process comprising the steps of:

(a) providing a substrate and an organic source material, (b) providing an evacuable, sealable chamber having two ends, the chamber having a means for vacuum outgassing the interior, means for introducing a buffer gas, a means for providing a temperature gradient between the two ends, the temperature of the first end being hotter than that of the second end, and outgassing the chamber, (c) introducing the substrate into the chamber, and positioning it at the second end, (d) introducing the source material into the chamber and positioning it near the first end, (e) outgassing he chamber to a pressure in the range of $10^{-6}$ to $10^{-10}$ Torr, and optionally introducing a buffer gas into the chamber at a pressure between 0.001 Torr and 10,000 Torr, (f) applying heat to the chamber such that the first end approaches 400° C. or is sufficient to sublime the source material, while cooling the second end to a temperature in the range of 20° C. and 100° C., (g) continuing such heating for a period of time sufficient to deposit the desired coating layer of source material at a thickness onto the substrate sufficient to provide a uniaxially oriented organic coated layer whose crystallographic molecular stacking axis is substantially inclined on average in the range of 0 degrees to less than 90 degrees with respect to the surface normal direction of the substrate, and (h) applying at least one additional organic coating over said coated substrate by depositing from the vapor phase at least one additional layer of crystalline organic material to provide a layered structure wherein the additionally coated layers are epitaxial with said coated layer of source material.

* * * * *

UNITED STATES PATENT AND TRADEMARK OFFICE
CERTIFICATE OF CORRECTION

PATENT NO. : 5,176,786

DATED : Jan. 5, 1993

INVENTOR(S) : Debe

It is certified that error appears in the above-identified patent and that said Letters Patent is hereby corrected as shown below:

Col. 7, line 47, Replace "oryo" with --cryo--

Col. 13, line 11, Replace "+1, +2, +3" with --$\pm 1, \pm 2, \pm 3$--

Col. 17, line 7, Insert --(d)-- before "epitaxially"

Signed and Sealed this

Thirtieth Day of November, 1993

BRUCE LEHMAN

*Commissioner of Patents and Trademarks*